(12) United States Patent
Choi et al.

(10) Patent No.: US 12,708,016 B2
(45) Date of Patent: Aug. 11, 2026

(54) SEMICONDUCTOR DEVICE

(71) Applicant: Samsung Electronics Co., Ltd., Suwon-si (KR)

(72) Inventors: Dongjoo Choi, Suwon-si (KR); Gunho Chang, Suwon-si (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 507 days.

(21) Appl. No.: 18/082,886

(22) Filed: Dec. 16, 2022

(65) Prior Publication Data

US 2023/0352429 A1 Nov. 2, 2023

(30) Foreign Application Priority Data

Apr. 29, 2022 (KR) ........................ 10-2022-0053737

(51) Int. Cl.

| | |
|---|---|
| ***H01L 21/768*** | (2006.01) |
| ***H01L 21/283*** | (2006.01) |
| ***H01L 23/52*** | (2006.01) |
| ***H10W 42/00*** | (2026.01) |
| ***H10W 72/00*** | (2026.01) |
| *H10W 72/90* | (2026.01) |
| *H10W 80/00* | (2026.01) |

(52) U.S. Cl.

CPC ......... *H10W 72/019* (2026.01); *H10W 42/00* (2026.01); *H10W 72/921* (2026.01); *H10W 72/923* (2026.01); *H10W 72/942* (2026.01); *H10W 80/102* (2026.01)

(58) Field of Classification Search

CPC ........... H01L 2224/80895; H01L 24/80; H01L 25/0657; H01L 2224/8034; H01L 2224/05571

See application file for complete search history.

(56) References Cited

U.S. PATENT DOCUMENTS

| | | | |
|---|---|---|---|
| 8,492,265 | B2 | 7/2013 | Yang et al. |
| 8,809,123 | B2 | 8/2014 | Liu et al. |
| 9,048,283 | B2 | 6/2015 | Liu et al. |
| 9,312,229 | B2 | 4/2016 | Chen et al. |
| 10,485,293 | B2 | 11/2019 | Hagimoto et al. |
| 10,607,937 | B2 | 3/2020 | Enquist et al. |

(Continued)

FOREIGN PATENT DOCUMENTS

| | | |
|---|---|---|
| KR | 20220036996 A | 3/2022 |

*Primary Examiner* — Kretelia Graham
*Assistant Examiner* — David J Goodwin
(74) *Attorney, Agent, or Firm* — Muir Patent Law, PLLC

(57) ABSTRACT

Disclosed is a semiconductor device comprising an upper pad surrounded by an upper dielectric layer, a lower pad in contact with the upper pad and the upper dielectric layer surrounded by a lower dielectric layer. The upper pad, the upper dielectric layer, the lower pad, and the lower dielectric layer define an upper space surrounding a lower portion of the upper pad and a lower space surrounding an upper portion of the lower pad. The upper space includes a first pad overlap section overlapping the lower pad and a first dielectric layer overlap section overlapping the lower dielectric layer. The lower pad includes a first protrusion part protruding toward the first pad overlap section of the upper space. The first protrusion part of the lower pad is at a level higher than that of a bottom surface of the upper dielectric layer.

18 Claims, 11 Drawing Sheets

(56) References Cited

U.S. PATENT DOCUMENTS

| | | | | |
|---|---|---|---|---|
| 10,685,935 | B2 | 6/2020 | Chen et al. | |
| 10,854,574 | B2 | 12/2020 | Chen et al. | |
| 2016/0013099 | A1* | 1/2016 | Tanida | H01L 25/18 438/107 |
| 2017/0243910 | A1* | 8/2017 | Ashidate | H01L 21/187 |
| 2018/0366671 | A1* | 12/2018 | Hong | H01L 21/76877 |
| 2019/0385966 | A1* | 12/2019 | Gao | H01L 24/03 |
| 2020/0075533 | A1 | 3/2020 | Gao et al. | |
| 2020/0126906 | A1 | 4/2020 | Uzoh et al. | |
| 2021/0066224 | A1 | 3/2021 | Jang et al. | |
| 2021/0217716 | A1 | 7/2021 | Wu et al. | |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2022-0053737 filed on Apr. 29, 2022 in the Korean Intellectual Property Office, the disclosure of which is hereby incorporated by reference in its entirety.

BACKGROUND

Aspects of the present inventive concept relate to a semiconductor device, and more particularly, to a semiconductor device including a bonding structure.

Semiconductor devices are beneficial in the electronic industry because of their small size, multi-functionality, and/or low fabrication cost. The semiconductor devices may be categorized as any one of semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. The increase in integration of the semiconductor device may induce a reduction in electrical properties and production yield of the semiconductor device. Hence, many studies have been conducted to increase electrical properties and production yield of the semiconductor device.

SUMMARY

Some embodiments of the present inventive concepts provide a semiconductor device with increased reliability and electrical properties.

According to some embodiments of the present inventive concepts, a semiconductor device may comprise: an upper pad; an upper dielectric layer that surrounds the upper pad, the upper dielectric layer extends in a first direction and a second direction that intersects the first direction; a lower pad in contact with the upper pad and the upper dielectric layer; and a lower dielectric layer that surrounds the lower pad and contacts the upper pad and the upper dielectric layer, the lower dielectric layer extends in the first direction and the second direction. The upper pad, the upper dielectric layer, the lower pad, and the lower dielectric layer may define an upper space that surrounds a lower portion of the upper pad and a lower space that surrounds an upper portion of the lower pad. The upper space may include a first pad overlap section that overlaps the lower pad in a third direction that intersects the first direction and the second direction, and a first dielectric layer overlap section that overlaps the lower dielectric layer. in the third direction The lower pad may include a first protrusion part that protrudes toward the first pad overlap section of the upper space. The first protrusion part of the lower pad may be at a level higher than a level of a bottom surface of the upper dielectric layer in the third direction.

According to some embodiments of the present inventive concepts, a semiconductor device may comprise: an upper pad; an upper dielectric layer that surrounds the upper pad, the upper dielectric layer extends in a first direction and a second direction that intersects the first direction; a lower pad in contact with the upper pad and the upper dielectric layer; and a lower dielectric layer that surrounds the lower pad and contacts the upper pad and the upper dielectric layer, the lower dielectric layer extends in the first direction and the second direction. The upper pad, the upper dielectric layer, the lower pad, and the lower dielectric layer may define an upper space that surrounds a lower portion of the upper pad and a lower space that surrounds an upper portion of the lower pad. The upper space may include a first pad overlap section that overlaps the lower pad in a third direction that intersects the first direction and the second direction and a first dielectric layer overlap section that overlaps the lower dielectric layer in the third direction. The lower pad may include a first surface in contact with the upper dielectric layer and a second surface in contact with the upper pad. The first pad overlap section may be between the first surface and the second surface of the lower pad. The first and second surfaces of the lower pad may be flat.

According to some embodiments of the present inventive concepts, a semiconductor device may comprise: a first substrate that extends in a first direction and a second direction that intersects the first direction; a second substrate spaced apart from the first substrate and that extends in the first direction and the second direction; a lower pad electrically connected to the first substrate; a lower dielectric layer that surrounds the lower pad; an upper pad electrically connected to the second substrate and in contact with the lower pad and the lower dielectric layer; and an upper dielectric layer that surrounds the upper pad and contacts the lower pad and the lower dielectric layer. The upper pad, the upper dielectric layer, the lower pad, and the lower dielectric layer may define an upper space that surrounds a lower portion of the upper pad and a lower space that surrounds an upper portion of the lower pad. The upper space may include a first pad overlap section that overlaps the lower pad in a third direction that intersects the first direction and the second direction, and a first dielectric layer overlap section that overlaps the lower dielectric layer in the third direction. The lower space may include a second pad overlap section that overlaps the upper pad in the third direction and a second dielectric layer overlap section that overlaps the upper dielectric layer in the third direction. The lower pad may include a first protrusion part that protrudes toward the first pad overlap section. The upper pad may include a second protrusion part that protrudes toward the second pad overlap section. The first protrusion part may be at a level higher than a level of a top surface of the lower dielectric layer. The second protrusion part may be at a level lower than a level of a bottom surface of the upper dielectric layer.

DETAIL PARTED DESCRIPTION OF EMBODIMENTS

The following will describe in detail a semiconductor device and its fabrication method according to some embodiments of the present inventive concepts with reference to the accompanying drawings.

Figure 1A:
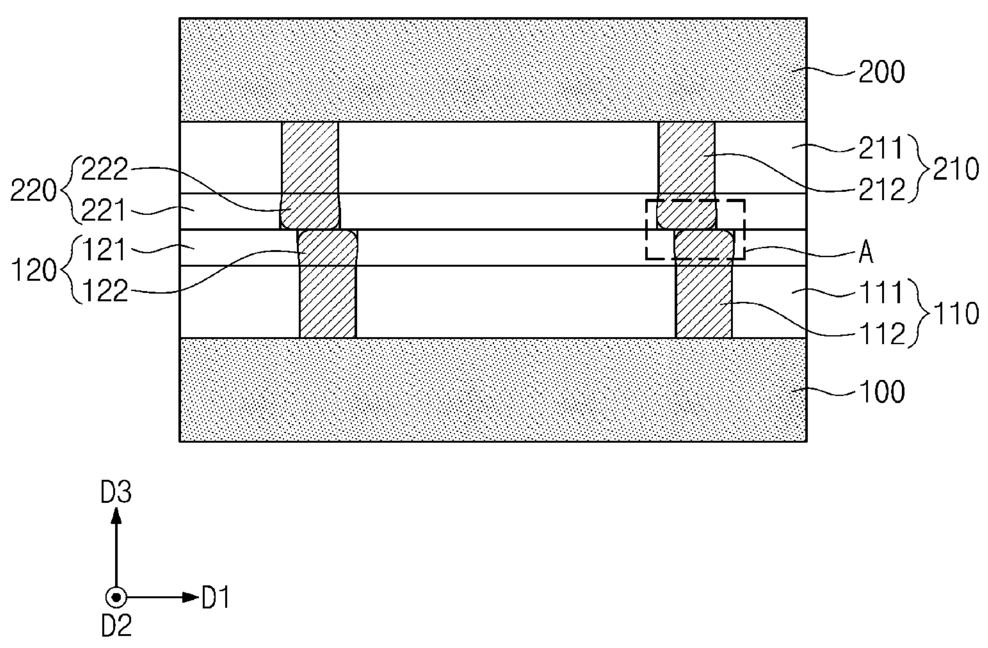
FIG. 1A illustrates a cross-sectional view showing a semiconductor device according to some embodiments.
Figure 1B:
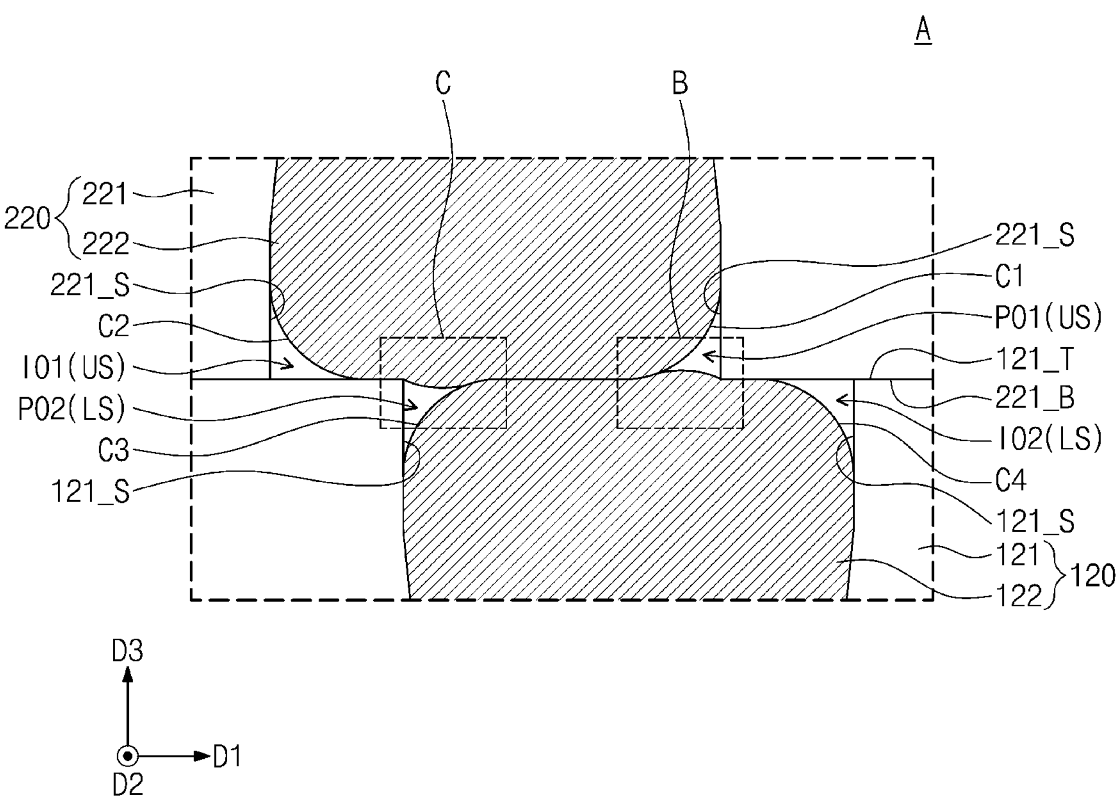
FIG. 1B illustrates an enlarged view showing section A of FIG. 1A.
Figure 1C:
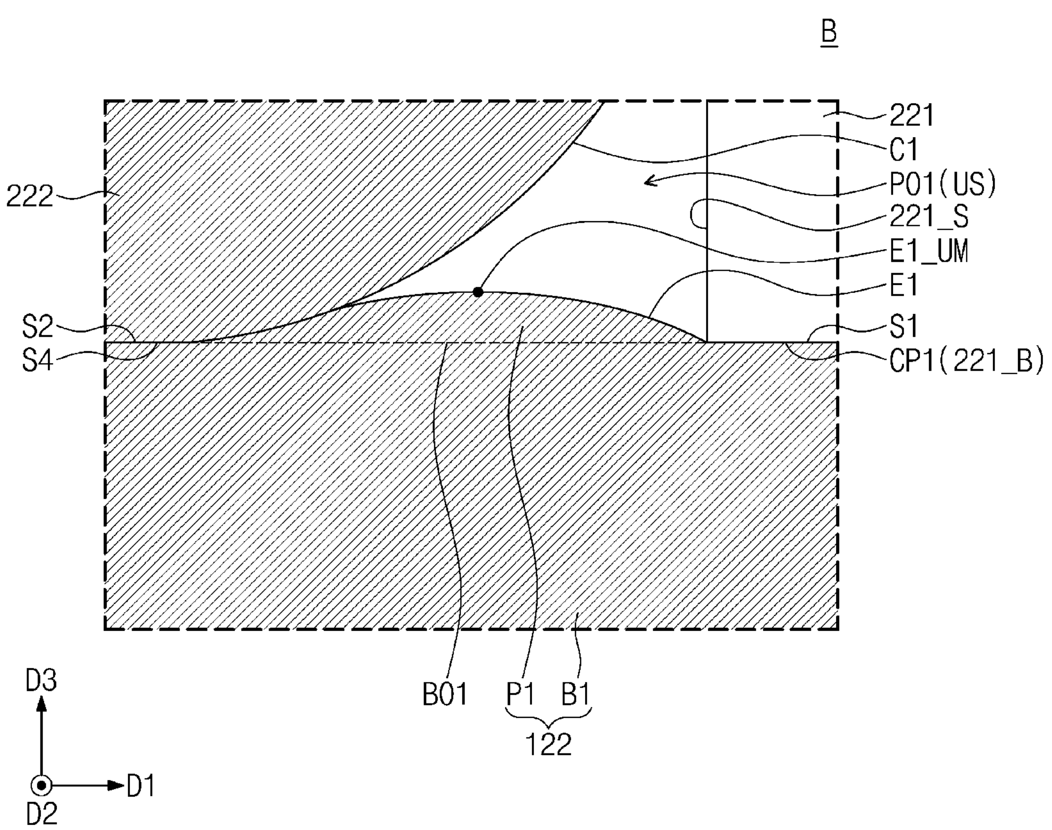
FIG. 1C illustrates an enlarged view showing section B of FIG. 1B.
Figure 1D:
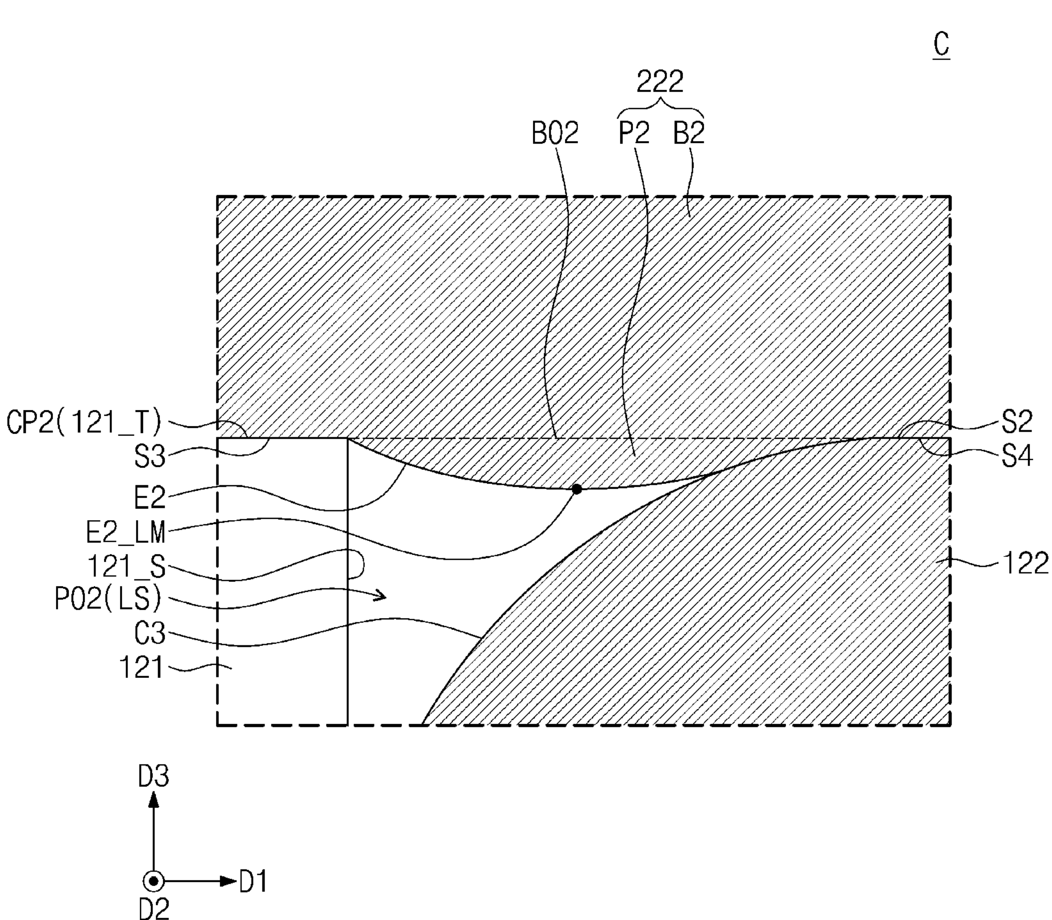
FIG. 1D illustrates an enlarged view showing section C of FIG. 1B.

FIG. 1A illustrates a cross-sectional view showing a semiconductor device according to some embodiments. FIG. 1B illustrates an enlarged view showing section A of FIG. 1A. FIG. 1C illustrates an enlarged view showing section B of FIG. 1B. FIG. 1D illustrates an enlarged view showing section C of FIG. 1B.

Referring to FIGS. 1A and 1B, a semiconductor device may include a first substrate 100, a first wiring structure 110 on the first substrate 100, a lower bonding structure 120 on the first wiring structure 110, an upper bonding structure 220 on the lower bonding structure 120, a second wiring structure 210 on the upper bonding structure 220, and a second substrate 200 on the second wiring structure 210.

The first substrate 100 and the second substrate 200 may be spaced apart from each other. Each of the first substrate 100 and the second substrate 200 may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other.

In some embodiments, each of the first and second substrates 100 and 200 may be a semiconductor substrate. For example, each of the first and second substrates 100 and 200 may include silicon, germanium, silicon-germanium, GaP, or GaAs. In some embodiments, each of the first and second substrates 100 and 200 may be a silicon-on-insulator (SOI) substrate or a germanium-on-insulator (GOI) substrate. In some embodiments, each of the first and second substrates 100 and 200 may be a redistribution substrate. In some embodiments, each of the first and second substrates 100 and 200 may be a printed circuit board (PCB). In some embodiments, the first and second substrates 100 and 200 may be different kinds of substrates.

The first wiring structure 110 may be disposed between the first substrate 100 and the second substrate 200. The first wiring structure 110 may include a first dielectric layer 111 and first conductive structures 112. The first conductive structures 112 may be provided in the first dielectric layer 111. The first dielectric layer 111 may surround the first conductive structures 112. The first dielectric layer 111 may extend in the first direction D1 and the second direction D2. The first dielectric layer 111 may be in contact with the first conductive structures 112. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first conductive structures 112 may be electrically connected to and in contact with the first substrate 100. The first conductive structures 112 may include a conductive material. In some embodiments, the first conductive structures 112 may include at least one selected from conductive contacts, conductive lines, conductive pads, redistribution patterns, conductive bumps, and through silicon vias. In some embodiments, the first dielectric layer 111 may be a multiple dielectric layer including a plurality of dielectric layers.

The lower bonding structure 120 may be disposed between the first substrate 100 and the second substrate 200. The lower bonding structure 120 may include a lower dielectric layer 121 and lower pads 122. The lower pads 122 may be provided in the lower dielectric layer 121. The lower dielectric layer 121 may surround and may be in contact with the lower pads 122. The lower dielectric layer 121 may extend in the first direction D1 and the second direction D2. In some embodiments, the semiconductor device may be configured such that, without the first wiring structure 110, the lower bonding structure 120 is directly connected to the first substrate 100.

The lower pad 122 may be in contact with the first conductive structure 112. The lower pad 122 may be electrically connected to the first substrate 100 through the first conductive structure 112. The lower pad 122 may include a conductive material. For example, the lower pad 122 may include copper.

The second wiring structure 210 may be disposed between the first substrate 100 and the second substrate 200. The second wiring structure 210 may include a second dielectric layer 211 and second conductive structures 212. The second conductive structures 212 may be provided in the second dielectric layer 211. The second dielectric layer 211 may surround the second conductive structures 212. The second dielectric layer 211 may extend in the first direction D1 and the second direction D2. The second dielectric layer 211 may be in contact with the second conductive structures 212.

The second conductive structures 212 may be electrically connected to and in contact with the second substrate 200. The second conductive structures 212 may include a conductive material. In some embodiments, the second conductive structures 212 may include at least one selected from conductive contacts, conductive lines, conductive pads, redistribution patterns, conductive bumps, and through silicon vias. In some embodiments, the second dielectric layer 211 may be a multiple dielectric layer including a plurality of dielectric layers.

The upper bonding structure 220 may be disposed between the first substrate 100 and the second substrate 200. The upper bonding structure 220 may include an upper dielectric layer 221 and upper pads 222. The upper pads 222 may be provided in the upper dielectric layer 221. The upper dielectric layer 221 may surround and may be in contact with the upper pads 222. The upper dielectric layer 221 may extend in the first direction D1 and the second direction D2. In some embodiments, the semiconductor device may be configured such that, without the second wiring structure 210, the upper bonding structure 220 is directly connected to the second substrate 200.

The upper pad 222 may be in contact with the second conductive structure 212. The upper pad 222 may be electrically connected to the second substrate 200 through the second conductive structure 212. The upper pad 222 may include a conductive material. For example, the upper pad 222 may include copper.

The upper bonding structure 220 and the lower bonding structure 120 may be bonded to each other. A bottom surface of the upper bonding structure 220 may be in contact with a top surface of the lower bonding structure 120. The lower pad 122 may be in contact with the upper dielectric layer 221 and the upper pad 222. The upper pad 222 may be in contact with the lower dielectric layer 121 and the lower pad 122. The upper dielectric layer 221 may be in contact with the lower dielectric layer 121. A bottom surface 221_B of the upper dielectric layer 221 may be in contact with a top surface 121_T of the lower dielectric layer 121.

The surfaces of the upper pad 222, the lower pad 122, the upper dielectric layer 221, and the lower dielectric layer 121 may define an upper space US and a lower space LS. For example, the surfaces of the upper pad 222, the lower pad 122, the upper dielectric layer 221, and the lower dielectric layer 121 may define boundaries of the upper space US and the lower space LS. The upper space US may be an empty space that is provided between the upper pad 222 and the upper dielectric layer 221. The upper space US may be an empty space that surrounds a lower portion of the upper pad 222. The lower space LS may be an empty space that is provided between the lower pad 122 and the lower dielectric layer 121. The lower space LS may be an empty space that surrounds an upper portion of the lower pad 122.

The upper space US may include a first pad overlap section PO1 that overlaps in a third direction D3 with the lower pad 122, and may also include a first dielectric layer overlap section IO1 that overlaps in the third direction D3 with the lower dielectric layer 121. The third direction D3 may intersect the first direction D1 and the second direction D2. For example, the third direction D3 may be perpendicular to the first direction D1 and the second direction D2.

The first pad overlap section PO1 (e.g., boundaries of the first pad overlap section PO1) may be defined by the surfaces of the upper pad 222, the lower pad 122, and the upper dielectric layer 221. The upper pad 222 may include a first curved surface C1 that defines a boundary of the first pad overlap section PO1. The first curved surface C1 may be curved. A sidewall 221_S of the upper dielectric layer 221 may have one portion that defines a boundary of the first pad overlap section PO1. The first curved surface C1 of the upper pad 222 and the one portion of the sidewall 221_S of the upper dielectric layer 221 may be exposed through the first pad overlap section PO1.

The first dielectric layer overlap section IO1 (e.g., boundaries of the first dielectric layer overlap section IO1) may be defined by the surfaces of the upper pad 222, the upper dielectric layer 221, and the lower dielectric layer 121. The upper pad 222 may include a second curved surface C2 that defines a boundary of the first dielectric layer overlap section IO1. The second curved surface C2 may be curved. The sidewall 221_S of the upper dielectric layer 221 may have another portion that defines a boundary of the first dielectric layer overlap section IO1. The second curved surface C2 of the upper pad 222 and the another portion of the sidewall 221_S of the upper dielectric layer 221 may be exposed through the first dielectric layer overlap section IO1.

The lower space LS may include a second pad overlap section PO2 that overlaps in the third direction D3 with the upper pad 222, and may also include a second dielectric layer overlap section IO2 that overlaps in the third direction D3 with the upper dielectric layer 221.

The second pad overlap section PO2 (e.g., boundaries of the second pad overlap section PO2) may be defined by the surfaces of the upper pad 222, the lower pad 122, and the lower dielectric layer 121. The lower pad 122 may include a third curved surface C3 that defines a boundary of the second pad overlap section PO2. The third curved surface C3 may be curved. A sidewall 121_S of the lower dielectric layer 121 may have one portion that defines a boundary of the second pad overlap section PO2. The third curved surface C3 of the lower pad 122 and the one portion of the sidewall 121_S of the lower dielectric layer 121 may be exposed through the second pad overlap section PO2.

The second dielectric layer overlap section IO2 (e.g., boundaries of the second dielectric layer overlap section IO2) may be defined by the surfaces of the lower pad 122, the upper dielectric layer 221, and the lower dielectric layer 121. The lower pad 122 may include a fourth curved surface C4 that defines a boundary of the second dielectric layer overlap section IO2. The fourth curved surface C4 may be curved. The sidewall 121_S of the lower dielectric layer 121 may have another portion that defines a boundary of the second dielectric layer overlap section IO2. The fourth curved surface C4 of the lower pad 122 and the another portion of the sidewall 121_S of the lower dielectric layer 121 may be exposed through the second dielectric layer overlap section IO2.

Referring to FIG. 1C, the lower pad 122 may include a first base part B1 and a first protrusion part P1. The first base part B1 may be a portion located at a lower level, in the third direction, than that of the upper dielectric layer 221 and that of the upper pad 222. The first protrusion part P1 may be a portion that protrudes in the third direction D3 from a top surface of the first base part B1. The first protrusion part P1 may protrude toward the first pad overlap section PO1 of the upper space US. The first protrusion part P1 may face the first curved surface C1 of the upper pad 222. A surface of the first protrusion part P1 may define a boundary of the first pad overlap section PO1 of the upper space US. The first protrusion part P1 may be located at a higher level, in the third direction, than that of the bottom surface 221_B of the upper dielectric layer 221. Spatially relative terms, such as "beneath," "below," "lower," "above," "upper," "higher" and the like, may be used herein for ease of description to describe positional relationships, such as illustrated in the figures, e.g. It will be understood that the spatially relative terms encompass different orientations of the device in addition to the orientation depicted in the figures.

The first base part B1 of the lower pad 122 may have a first surface S1 in contact with the bottom surface 221_B of the upper dielectric layer 221 and a second surface S2 in contact with the upper pad 222. The first and second surfaces S1 and S2 of the lower pad 122 may be flat (e.g., substantially planar). The first protrusion part P1 may be disposed between the first surface S1 and the second surface S2 of the lower pad 122. The first surface S1 of the lower pad 122 may be disposed between the first pad overlap section PO1 of the upper space US and the second dielectric layer overlap section IO2 of the lower space LS. The first pad overlap section PO1 of the upper space US may be disposed between the first surface S1 and the second surface S2 of the lower pad 122. The first protrusion part P1 may protrude from the first surface S1 and the second surface S2 of the lower pad 122. A boundary BO1 between the first base part B1 and the first protrusion part P1 of the lower pad 122 may be located at the same level, in the third direction, as that of the bottom surface 221_B of the upper dielectric layer 221 and that of the first and second surfaces S1 and S2 of the lower pad 122. The first surface S1 of the lower pad 122 may have a width less than that of the second surface S2 of the lower pad 122. For example, a width in the first direction D1 of the first surface S1 included in the lower pad 122 may be less than a width in the first direction D1 of the second surface S2 included in the lower pad 122. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first protrusion part P1 may have a first exposed surface E1 that is revealed through the first pad overlap section PO1 of the upper space US. The first exposed surface E1 may be curved. The first exposed surface E1 may be connected to the first and second surfaces S1 and S2 of the lower pad 122. An uppermost portion E1_UM of the first exposed surface E1 may be located at a higher level, in the third direction, than that of the bottom surface 221_B of the upper dielectric layer 221 and that of the first and second surfaces S1 and S2 of the lower pad 122. The level of the first exposed surface E1, in the third direction, may decrease in a direction from the uppermost portion E1_UM of the first exposed surface E1 toward the sidewall 221_S of the upper dielectric layer 221. The level of the first exposed surface E1, in the third direction, may decrease in a direction from the uppermost portion E1_UM of the first exposed surface E1 toward the first surface S1 of the lower pad 122. The level of the first exposed surface E1, in the third direction, may decrease in a direction from the uppermost portion E1_UM of the first exposed surface E1 toward the second surface S1 of the lower pad 122. A height (e.g., thickness) in the third direction D3 of the first protrusion part P1 may be maximum at the uppermost portion E1_UM of the first exposed surface E1. The height in the third direction D3 of the first protrusion part P1 may decrease in a direction (e.g., the first direction D1) from the uppermost portion E1_UM of the first exposed surface E1 toward the first surface S1 of the lower pad 122. The height in the third direction D3 of the first protrusion part P1 may decrease in a direction (e.g., the first direction D1) from the uppermost portion E1_UM of the first exposed surface E1 toward the second surface S2 of the lower pad 122.

The bottom surface 221_B of the upper dielectric layer 221 may include a first contact part CP1 in contact with the first surface S1 of the lower pad 122. The first contact part CP1 of the bottom surface 221_B of the upper dielectric layer 221 may be flat (e.g., substantially planar). The first contact part CP1 of the bottom surface 221_B of the upper dielectric layer 221 may be disposed between the first pad overlap section PO1 of the upper space US and the second dielectric layer overlap section IO2 of the lower space LS.

Referring to FIG. 1D, the upper pad 222 may include a second base part B2 and a second protrusion part P2. The second base part B2 may be a portion located at a higher level, in the third direction, than that of the lower dielectric layer 121 and that of the lower pad 122. The second protrusion part P2 may be a portion that protrudes from a bottom surface of the second base part B2 in the third direction D3. The second protrusion part P2 may protrude in the third direction D3 toward the second pad overlap section PO2 of the lower space LS. The second protrusion part P2 may face the third curved surface C3 of the lower pad 122. A surface of the second protrusion part P2 may define a boundary of the second pad overlap section PO2 of the lower space LS. The second protrusion part P2 may be located at a lower level, in the third direction, than that of a top surface 121_T of the lower dielectric layer 121.

The second base part B2 of the upper pad 222 may include a third surface S3 in contact with the top surface 121_T of the lower dielectric layer 121 and a fourth surface S4 in contact with the second surface S2 of the lower pad 122. The third and fourth surfaces S3 and S4 of the upper pad 222 may be flat (e.g., substantially planar). The second protrusion part P2 may be disposed between the third surface S3 and the fourth surface S4 of the upper pad 222. The third surface S3 of the upper pad 222 may be disposed between the second pad overlap section PO2 of the lower space LS and the first dielectric layer overlap section IO1 of the upper space US. The second pad overlap section PO2 of the lower space LS may be disposed between the third surface S3 and the fourth surface S4 of the upper pad 222. The second protrusion part P2 may protrude from the third surface S3 and the fourth surface S4 of the upper pad 222. A boundary BO2 between the second base part B2 and the second protrusion part P2 of the upper pad 222 may be located at the same level, in the third direction, as that of the top surface 121_T of the lower dielectric layer 121 and that of the third and fourth surfaces S3 and S4 of the upper pad 222. The third surface S3 of the upper pad 222 may have a width less than that of the fourth surface S4 of the upper pad 222. For example, a width in the first direction D1 of the third surface S3 included in the upper pad 222 may be less than a width in the first direction D1 of the fourth surface S4 included in the upper pad 222.

The second protrusion part P2 may have a second exposed surface E2 that is revealed through the second pad overlap section PO2 of the lower space LS. The second exposed surface E2 may be curved. The second exposed surface E2 may be connected to the third and fourth surfaces S3 and S4 of the upper pad 222. A lowermost portion E2_LM of the second exposed surface E2 may be located at a level lower, in the third direction, than that of the top surface 121_T of the lower dielectric layer 121 and that of the third and fourth surfaces S3 and S4 of the upper pad 222. The level of the second exposed surface E2, in the third direction, may increase in a direction from the lowermost portion E2_LM of the second exposed surface E2 toward the sidewall 121_S of the lower dielectric layer 121. The level of the second exposed surface E2, in the third direction, may increase in a direction from the lowermost portion E2_LM of the second exposed surface E2 toward the third surface S3 of the upper pad 222. The level of the second exposed surface E2, in the third direction, may increase in a direction from the lowermost portion E2_LM of the second exposed surface E2 toward the fourth surface S4 of the upper pad 222. A height (e.g., thickness) in the third direction D3 of the second protrusion part P2 may be maximum at the lowermost portion E2_LM of the second exposed surface E2. The height in the third direction D3 of the second protrusion part P2 may decrease in a direction from the lowermost portion E2_LM of the second exposed surface E2 toward the third surface S3 of the upper pad 222. The height in the third direction D3 of the second protrusion part P2 may decrease in a direction from the lowermost portion E2_LM of the second exposed surface E2 toward the fourth surface S4 of the upper pad 222.

The top surface 121_T of the lower dielectric layer 121 may include a second contact part CP2 in contact with the third surface S3 of the upper pad 222. The second contact part CP2 of the top surface 121_T of the lower dielectric layer 121 may be flat (e.g., substantially planar). The second contact part CP2 of the top surface 121_T of the lower dielectric layer 121 may be disposed between the second pad overlap section PO2 of the lower space LS and the first dielectric layer overlap section IO1 of the upper space US.

According to some embodiments, the semiconductor device may be configured such that the lower bonding structure 120 and the upper bonding structure 220 are provided therebetween with a plurality of spaces that are divided into the first and second pad overlap sections PO1 and PO2 and the first and second dielectric layer overlap sections IO1 and IO2. Therefore, it may be possible to minimize stress caused by expansion or contraction of the upper and lower pads 122 and 222 and to minimize delamination between the upper and lower pads 122 and 222 and the upper and lower dielectric layers 121 and 221.

Figure 2A:
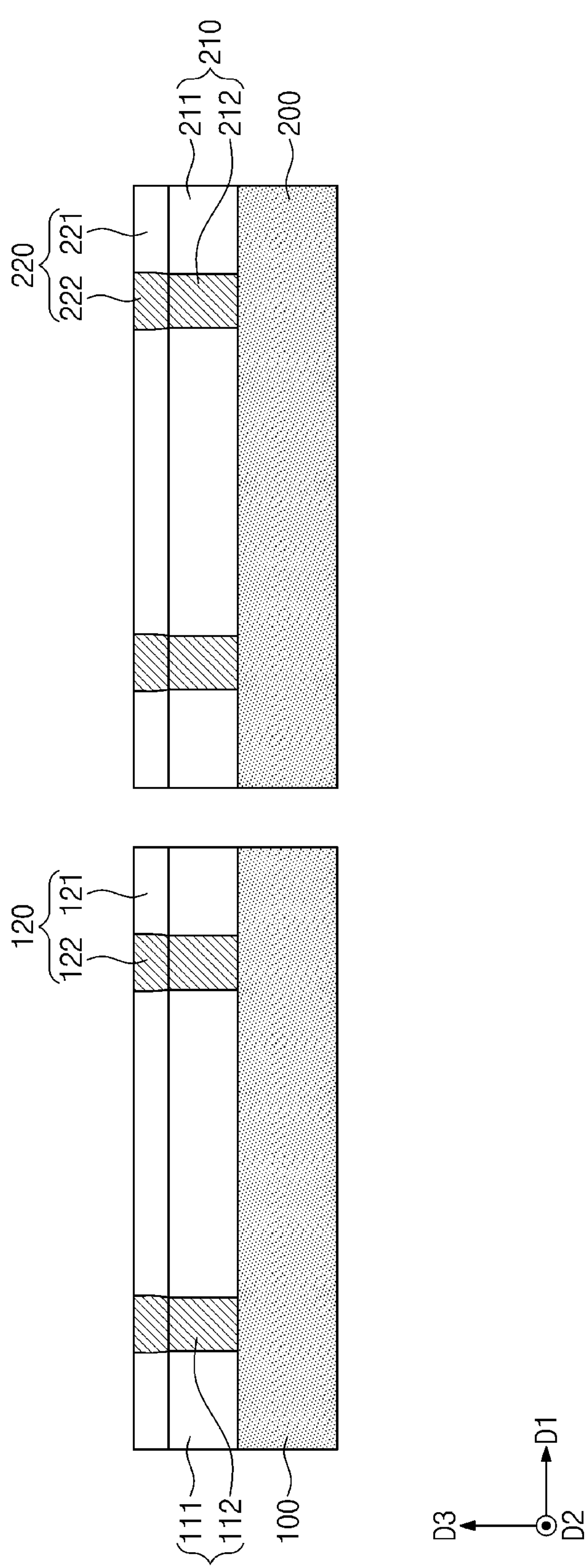
FIGS. 2A, 2B, and 2C illustrate cross-sectional views showing a method of fabricating the semiconductor device depicted in FIGS. 1A to 1D.
Figure 2B:
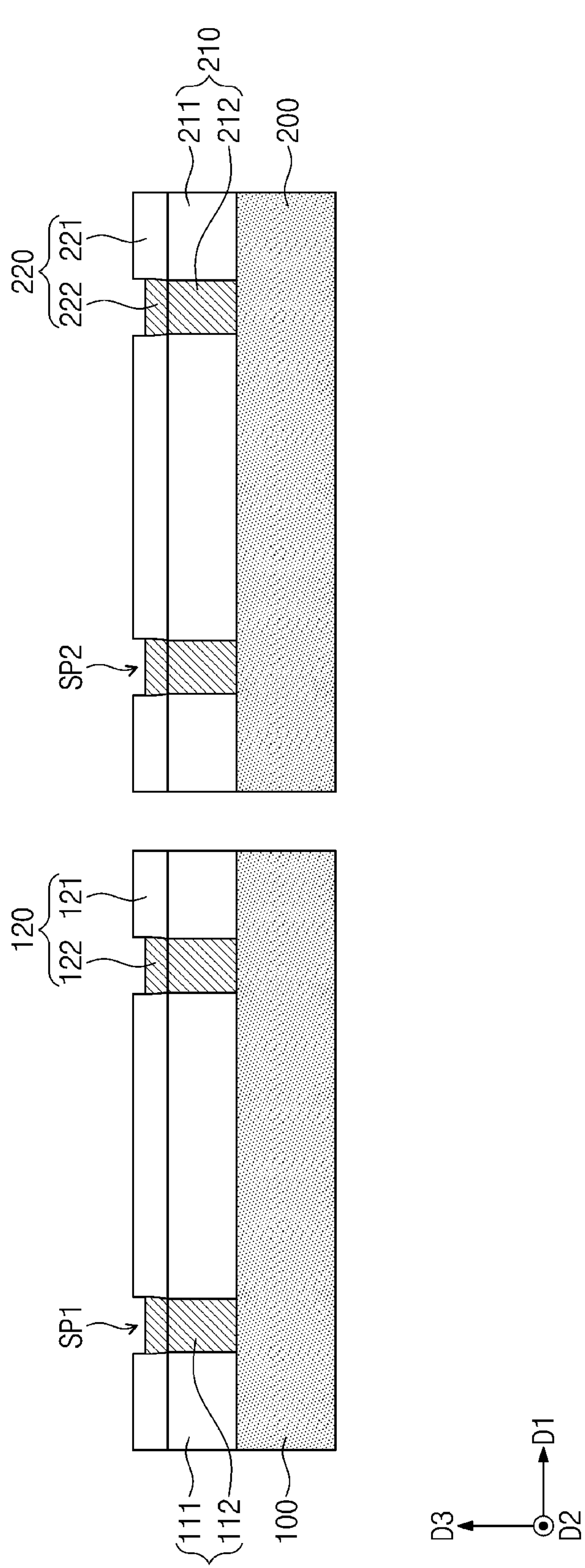
Figure 2C:
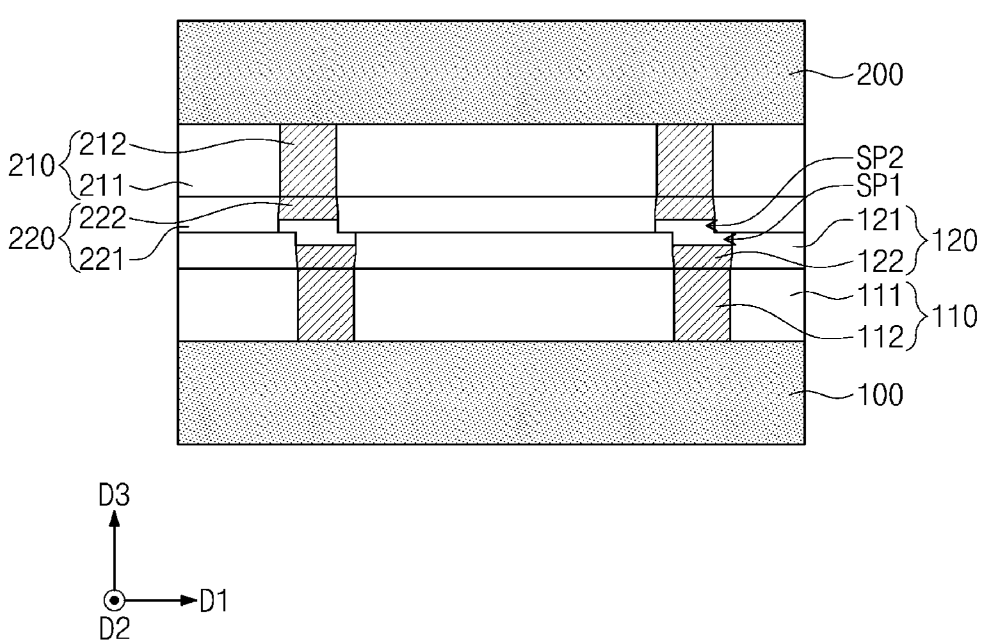

FIGS. 2A, 2B, and 2C illustrate cross-sectional views showing a method of fabricating the semiconductor device depicted in FIGS. 1A to 1D.

Referring to FIG. 2A, a first wiring structure 110 may be formed on a first substrate 100, which first wiring structure 110 includes a first dielectric layer 111 and first conductive structures 112. A lower bonding structure 120 may be formed on the first wiring structure 110, which lower bonding structure 120 includes a lower dielectric layer 121 and lower pads 122. In some embodiments, the formation of the lower bonding structure 120 may include forming the lower dielectric layer 121 on the first wiring structure 110, and forming the lower pads 122 that penetrate the lower dielectric layer 121.

A second wiring structure 210 may be formed on a second substrate 200, which second wiring structure 210 includes a second dielectric layer 211 and second conductive structures 212. An upper bonding structure 220 may be formed on the second wiring structure 210, which upper bonding structure 220 includes an upper dielectric layer 221 and upper pads 222. In some embodiments, the formation of the upper bonding structure 220 may include forming the upper dielectric layer 221 on the second wiring structure 210, and forming the upper pads 222 that penetrate the upper dielectric layer 221.

Referring to FIG. 2B, the lower pads 122 may be etched. The lower pads 122 may be etched to form first spaces SP1 surrounded by the lower dielectric layer 121.

The upper pads 222 may be etched. The upper pads 222 may be etched to form second spaces SP2 surrounded by the upper dielectric layer 221.

Referring to FIG. 2C, the second substrate 200 may be flipped and placed on the first substrate 100. Afterwards, the lower bonding structure 120 and the upper bonding structure 220 may be bonded to each other.

The lower and upper bonding structures 120 and 220 may be bonded to allow the lower pad 122 and the upper pad 222 to partially overlap each other in the third direction D3. The lower pad 122 may include a portion that overlaps the upper dielectric layer 221 and a portion that overlaps the upper pad 222 in the third direction. The upper pad 222 may include a portion that overlaps the lower dielectric layer 121 and a portion that overlaps the lower pad 122 in the third direction.

The lower and upper bonding structures 120 and 220 may be bonded to connect the first space SP1 and the second space SP2 to each other. The first space SP1 and the second space SP2 may be provided between the upper pad 222 and the lower pad 122.

Referring back to FIGS. 1A to 1D, a heat treatment process may be performed. For example, the heat treatment process may be an annealing process. The heat treatment process may expand the lower pads 122 and the upper pads 222. The lower pad 122 and the upper pad 222 may be connected and in contact with each other through their expansion. The connected first and second spaces SP1 and SP2 may be partially filled with the expanded lower and upper pads 122 and 222. A lower space LS may be defined to indicate an unoccupied portion of the first space SP1 partially filled with the lower pad 122. For example, the lower space LS includes portions of the first space SP1 unfilled by the lower pad 122 or the upper pad 222. An upper space US may be defined to indicate an unoccupied portion of the second space SP2 partially filled with the upper pad 222. For example, the upper space US includes portions of the second space SP2 unfilled by the upper pad 222 or the lower pad 122.

The expansion of the lower pad 122 may form a first protrusion part P1 of the lower pad 122. The expansion of the upper pad 222 may form a second protrusion part P2 of the upper pad 222.

According to some embodiments, as the lower bonding structure 120 and the upper bonding structure 220 are bonded to allow the lower and upper pads 122 and 222 to partially overlap each other in the third direction D3, spaces may be obtained between the lower bonding structure 120 and the upper bonding structure 220.

Figure 3:
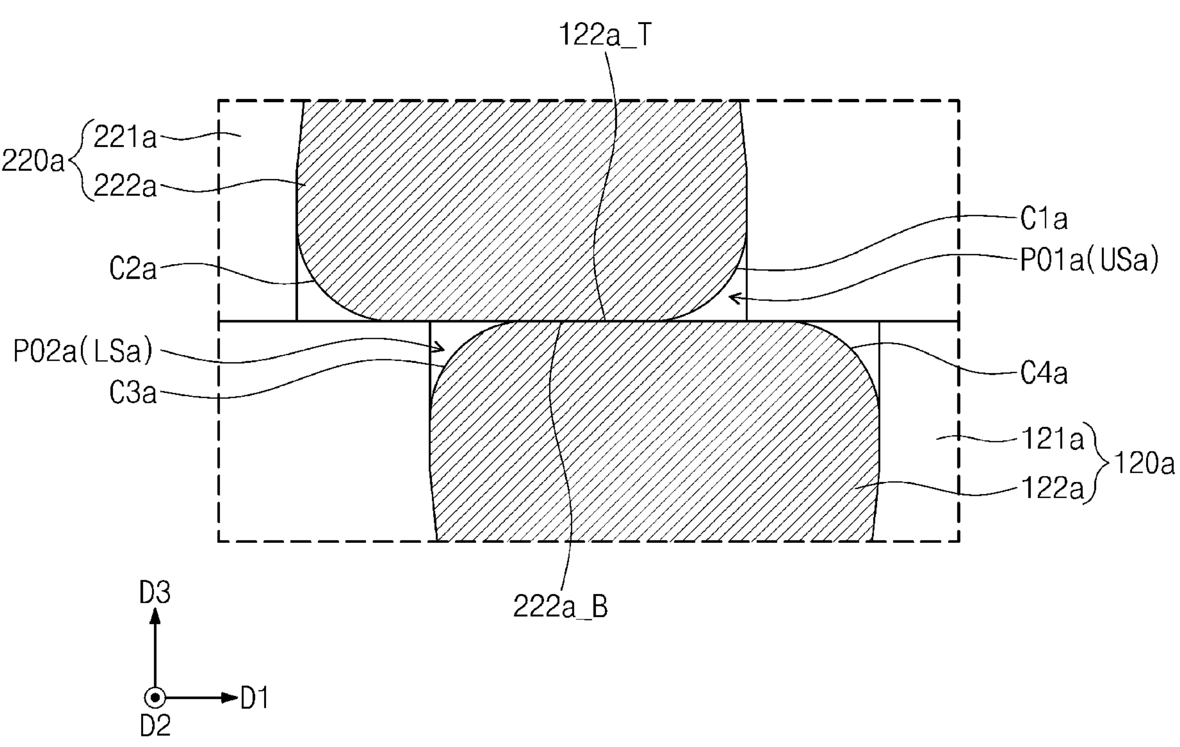
FIG. 3 illustrates a cross-sectional view showing a semiconductor device according to some embodiments.

FIG. 3 illustrates a cross-sectional view showing a semiconductor device according to some embodiments.

Referring to FIG. 3, a semiconductor device may include a lower bonding structure 120*a* and an upper bonding structure 220*a* that are bonded to each other. The lower bonding structure 120*a* may include a lower pad 122*a* and a lower dielectric layer 121*a* that surrounds and is in contact with the lower pad 122*a*. The upper bonding structure 220*a* may include an upper pad 222*a* and an upper dielectric layer 221*a* that surrounds and is in contact with the upper pad 222*a*.

The lower pad 122*a* may have a flat (e.g., substantially planar) top surface 122*a*_T. The upper pad 222*a* may have a flat (e.g., substantially planar) bottom surface 222*a*_B. The top surface 122*a*_T of the lower pad 122*a* may be in contact with the bottom surface 222*a*_B of the upper pad 222*a*. The bottom surface 222*a*_B of the upper pad 222*a* may connect, to each other, a first curved surface C1*a* and a second curved surface C2*a* of the upper pad 222*a*. The top surface 122*a*_T of the lower pad 122*a* may connect, to each other, a third curved surface C3*a* and a fourth curved surface C4*a* of the lower pad 122*a*.

An upper space USa may include a first pad overlap section PO1*a* that is defined by the top surface 122*a*_T of the lower pad 122*a*, the first curved surface C1*a* of the upper pad 222*a*, and a sidewall of the upper dielectric layer 221*a*. For example, the top surface 122*a*_T of the lower pad 122*a*, the first curved surface C1*a* of the upper pad 222*a*, and a sidewall of the upper dielectric layer 221*a* may define boundaries of the first pad overlap section PO1*a*. A lower space LSa may include a second pad overlap section PO2*a* that is defined by the bottom surface 222*a*_B of the upper pad 222*a*, the third curved surface C3*a* of the lower pad 122*a*, and a sidewall of the lower dielectric layer 121*a*. For example the bottom surface 222*a*_B of the upper pad 222*a*, the third curved surface C3*a* of the lower pad 122*a*, and a sidewall of the lower dielectric layer 121*a* may define boundaries of the second pad overlap section PO2*a*.

Figure 4:
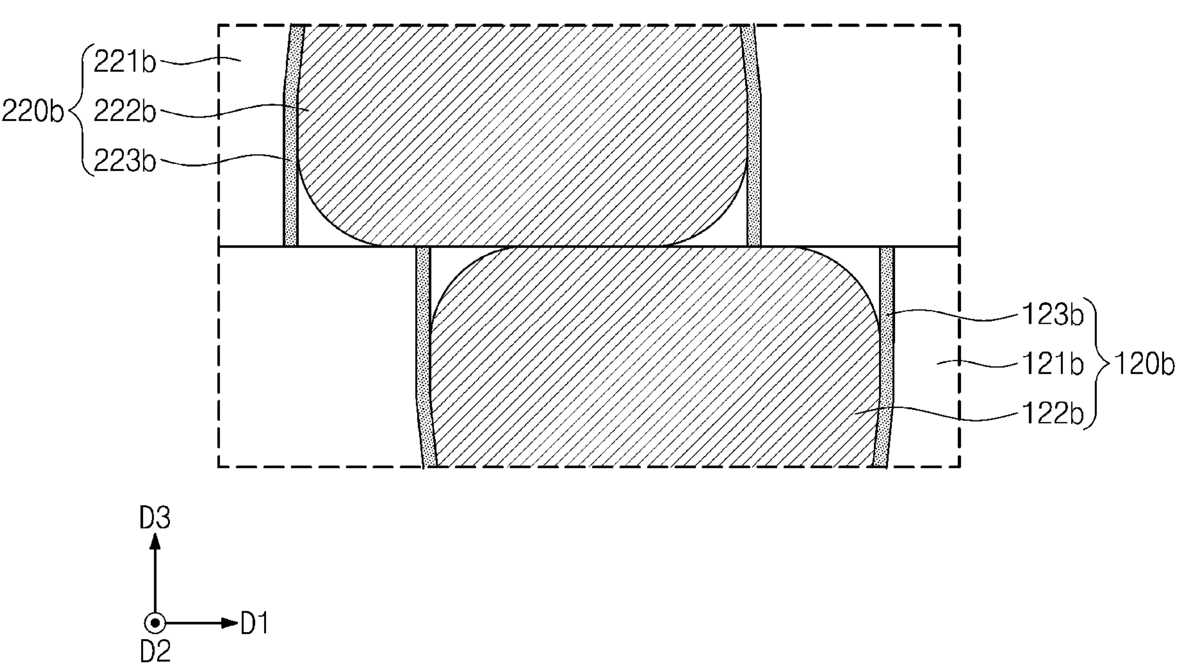
FIG. 4 illustrates a cross-sectional view showing a semiconductor device according to some embodiments.

FIG. 4 illustrates a cross-sectional view showing a semiconductor device according to some embodiments.

Referring to FIG. 4, a semiconductor device may include a lower bonding structure 120*b* and an upper bonding structure 220*b* that are bonded to each other. The lower bonding structure 120*b* may include a lower pad 122*b* and a lower dielectric layer 121*b* that surrounds and is in contact with the lower pad 122*b*. The upper bonding structure 220*b* may include an upper pad 222*b* and an upper dielectric layer 221*b* that surrounds and is in contact with the upper pad 222*b*.

The lower bonding structure 120*b* may further include a lower protection layer 123*b*. The lower protection layer 123*b* may be interposed between the lower pad 122*b* and the lower dielectric layer 121*b*. The lower protection layer 123*b* may be in contact with the lower pad 122*b* and the lower dielectric layer 121*b*. The upper bonding structure 220*b* may further include an upper protection layer 223*b*. The upper protection layer 223*b* may be interposed between the upper pad 222*b* and the upper dielectric layer 221*b*. The upper protection layer 223*b* may be in contact with the upper pad 222*b* and the upper dielectric layer 221*b*.

Figure 5A:
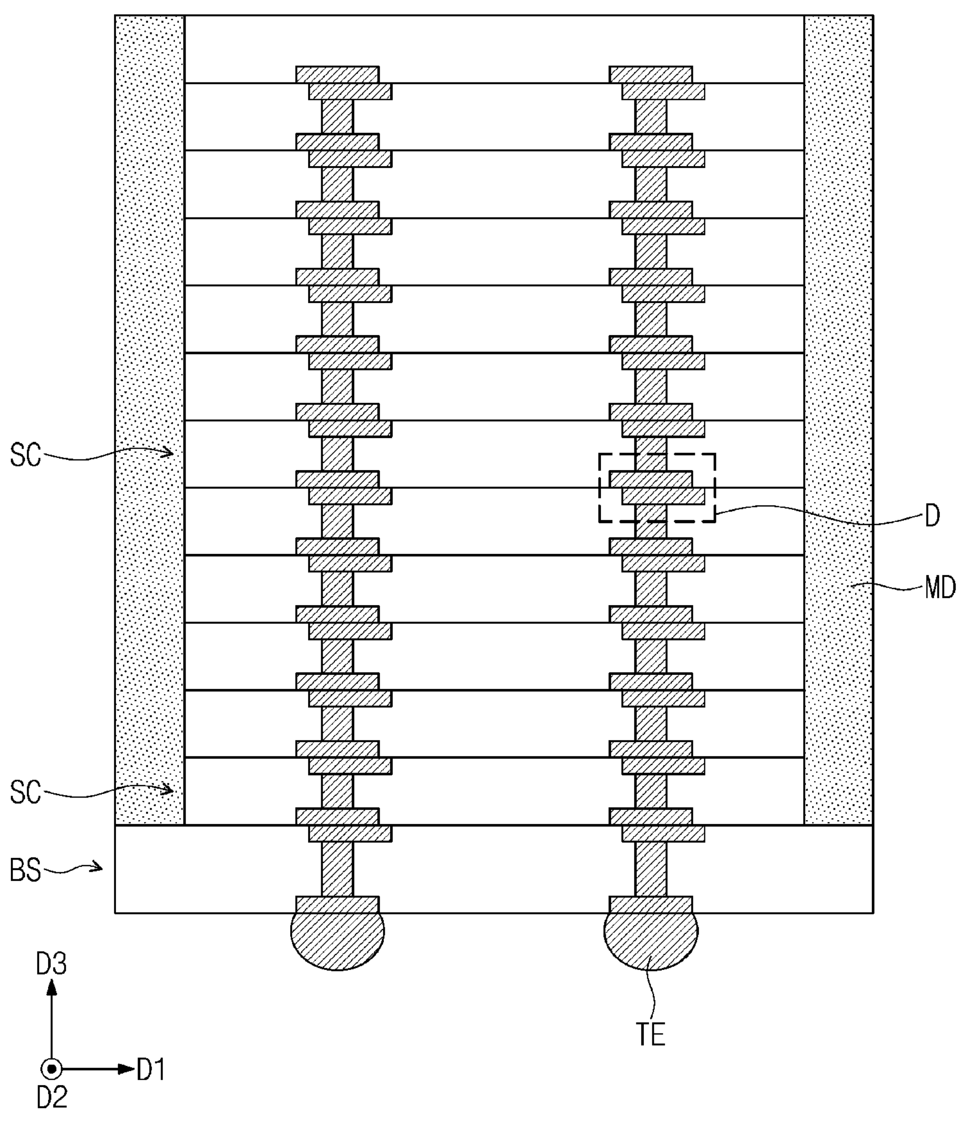
FIG. 5A illustrates a cross-sectional view showing a semiconductor device according to some embodiments.
Figure 5B:
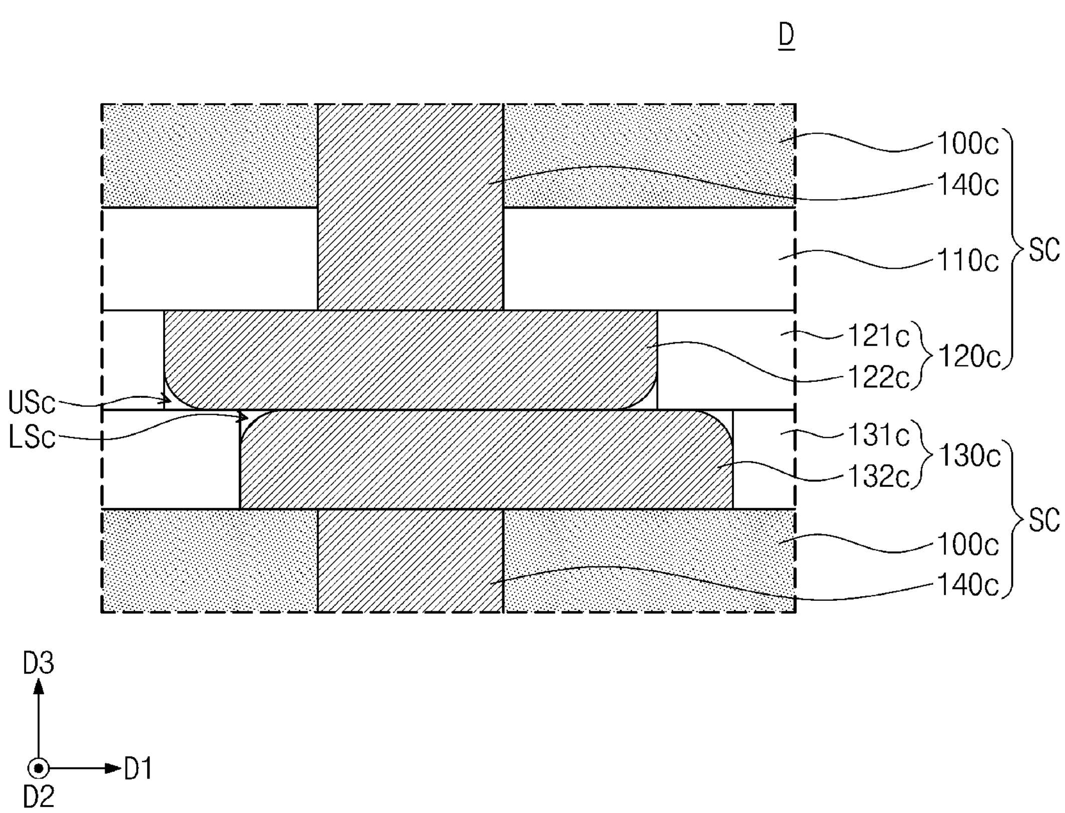
FIG. 5B illustrates an enlarged view showing section D of FIG. 5A.

FIG. 5A illustrates a cross-sectional view showing a semiconductor device according to some embodiments. FIG. 5B illustrates an enlarged view showing section D of FIG. 5A.

Referring to FIGS. 5A and 5B, a semiconductor device may include a base structure BS and semiconductor chips SC disposed on the base structure BS. It is illustrated that twelve semiconductor chips SC are provided, but no limitation is imposed on the number of the semiconductor chips SC. The base structure BS may be provided thereon with a molding layer MD that encapsulates the semiconductor chips SC. Terminals TE may be provided which are connected to the base structure BS. The semiconductor device may be electrically connected through the terminals TE to an external apparatus.

Each of the semiconductor chips SC may include a substrate 100*c*, a dielectric structure 110*c*, a lower bonding structure 120*c*, an upper bonding structure 130*c*, and a conductive structure 140*c*. In some embodiments, the substrate 100*c* may be a semiconductor substrate.

The dielectric structure 110*c* may cover a bottom surface of the substrate 100*c*. In some embodiments, a semiconductor element may be provided between the substrate 100*c* and the dielectric structure 110*c*. For example, the semiconductor element may be a memory device, a logic device, or an image sensor device. The dielectric structure 110*c* may include at least one selected from a conductive contact, a conducive line, and a conductive pad that are connected to the semiconductor apparatus.

The lower bonding structure 120*c* may cover a bottom surface of the dielectric structure 110*c*. The lower bonding structure 120*c* may include a lower pad 122*c* and a lower dielectric layer 121*c*. The upper bonding structure 130*c* may cover a top surface of the substrate 100*c*. The upper bonding structure 130*c* may include an upper pad 132*c* and an upper dielectric layer 131*c*. Within each of the semiconductor chips SC, the conductive structure 140*c* may electrically connect the lower pad 122*c* and the upper pad 132*c* to each other. In some embodiments, the conductive structure 140*c* may be a through silicon via that penetrates the substrate 100*c*.

The upper bonding structure 130*c* of one semiconductor chip SC may be bonded to the lower bonding structure 120*c* of another semiconductor chip SC. For example, the upper bonding structure 130*c* of a first semiconductor chip SC and the lower bonding structure 120*c* of a second semiconductor chip SC may be bonded such that the semiconductor chips SC may be provided therebetween with an upper space USc and a lower space LSc.

In some embodiments, the base structure BS may be a buffer semiconductor chip whose structure is similar to that of the semiconductor chip SC. In some embodiments, the base structure BS may have a different structure from that of the semiconductor chip SC. For example, the base structure BS may be a redistribution substrate or a printed circuit board.

Figure 6:
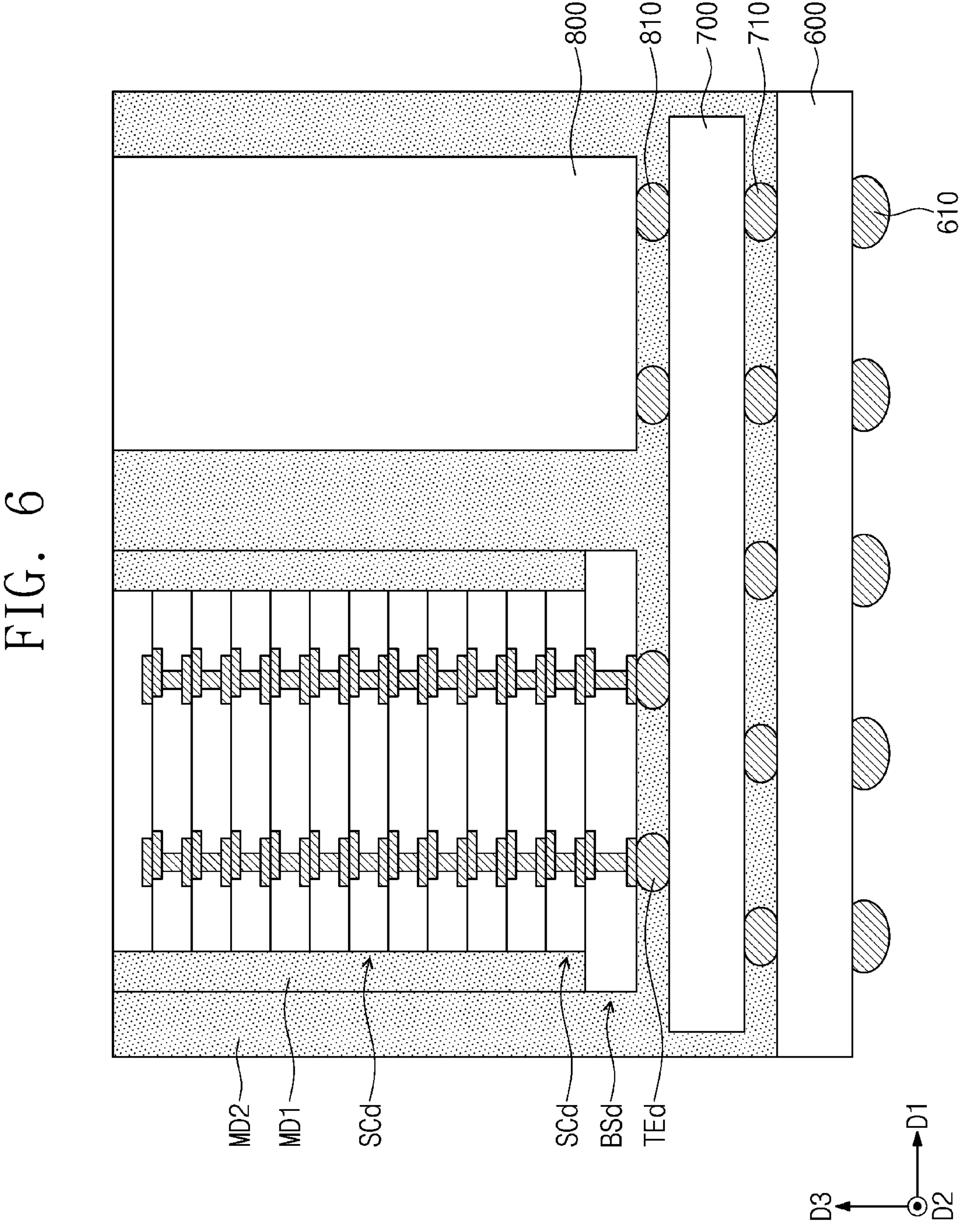
FIG. 6 illustrates a cross-sectional view showing a semiconductor device according to some embodiments.

FIG. 6 illustrates a cross-sectional view showing a semiconductor device according to some embodiments.

Referring to FIG. 6, a semiconductor device may include a package substrate 600. For example, the package substrate 600 may be a printed circuit board (PCB). The package substrate 600 may be provided with first terminals 610 electrically connected thereto. The semiconductor device may be electrically connected through the first terminals 610 to an external apparatus (e.g., a main board).

An interposer 700 may be provided on the package substrate 600. Second terminals 710 may be provided to electrically connect the package substrate 600 and the interposer 700 to each other. The second terminals 710 may be provided between the package substrate 600 and the interposer 700.

A processor chip 800 may be provided on the interposer 700. For example, the processor chip 800 may be a graphic processing unit (GPU) or a central processing unit (CPU). Third terminals 810 may be provided to electrically connect the processor chip 800 and the interposer 700 to each other. The third terminals 810 may be provided between the processor chip 800 and the interposer 700.

The interposer 700 may be provided thereon with a base structure BSd and semiconductor chips SCd. The base structure BSd and the semiconductor chips SCd may be spaced apart in a first direction D1 from the processor chip 800. Fourth terminals TEd may be provided to electrically connect the base structure BSd and the interposer 700 to each other. The fourth terminals TEd may be provided between the base structure BSd and the interposer 700. A first molding layer MD1 may be provided to encapsulate the base structure BSd and the semiconductor chips SCd.

The package substrate 600 may be provided thereon with a second molding layer MD2 that encapsulate the interposer 700, the processor chip 800, the base structure BSd, and the semiconductor chips SCd.

In a semiconductor device according to some embodiments of the present inventive concepts, a plurality of spaces may be provided between an upper bonding structure and a lower bonding structure, and thus it may be possible to minimize stress caused by expansion of pads.

Although the present invention has been described in connection with the example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:

an upper pad;

an upper dielectric layer that surrounds the upper pad, the upper dielectric layer extends in a first direction and a second direction that intersects the first direction;

a lower pad in contact with the upper pad and the upper dielectric layer; and a lower dielectric layer that surrounds the lower pad and contacts the upper pad and the upper dielectric layer, the lower dielectric layer extends in the first direction and the second direction, wherein the upper pad, the upper dielectric layer, the lower pad, and the lower dielectric layer define an upper space that surrounds a lower portion of the upper pad and a lower space that surrounds an upper portion of the lower pad, wherein the upper space includes a first pad overlap section that overlaps the lower pad in a third direction that intersects the first direction and the second direction, and a first dielectric layer overlap section that overlaps the lower dielectric layer in the third direction, wherein the lower pad includes a first protrusion part that protrudes toward the first pad overlap section of the upper space, wherein the first protrusion part of the lower pad is at a level higher than a level of a bottom surface of the upper dielectric layer in the third direction, wherein the lower pad includes a first surface in contact with the upper dielectric layer and a second surface in contact with the upper pad, and wherein the first protrusion part of the lower pad is between the first surface and the second surface of the lower pad.

2. The semiconductor device of claim 1, wherein the lower space includes a second pad overlap section that overlaps the upper pad in the third direction and a second dielectric layer overlap section that overlaps the upper dielectric layer in the third direction, the upper pad includes a second protrusion part that protrudes toward the second pad overlap section of the lower space, and the second protrusion part of the upper pad is at a level lower than a level of a top surface of the lower dielectric layer in the third direction.

3. The semiconductor device of claim 2, wherein the first pad overlap section of the upper space is between the first surface and the second surface of the lower pad.

4. The semiconductor device of claim 2, wherein the first and second surfaces of the lower pad are flat.

5. The semiconductor device of claim 2, wherein the first surface of the lower pad is between the first pad overlap section of the upper space and the second dielectric layer overlap section of the lower space.

6. The semiconductor device of claim 5, wherein the bottom surface of the upper dielectric layer includes a contact part in contact with the first surface of the lower pad, and wherein the contact part of the bottom surface of the upper dielectric layer is between the first pad overlap section of the upper space and the second dielectric layer overlap section of the lower space.

7. The semiconductor device of claim 2, wherein a width of the first surface of the lower pad in the first direction is less than a width of the second surface of the lower pad in the first direction.

8. The semiconductor device of claim 1, wherein the first protrusion part of the lower pad includes an exposed surface that is revealed by the first pad overlap section of the upper space, and wherein the exposed surface is curved.

9. The semiconductor device of claim 8, wherein a level of the exposed surface in the third direction decreases as the exposed surface extends in the first direction.

10. The semiconductor device of claim 8, wherein the upper pad includes a curved surface that faces the exposed surface.

11. A semiconductor device, comprising:

an upper pad;

an upper dielectric layer that surrounds the upper pad, the upper dielectric layer extends in a first direction and a second direction that intersects the first direction;

a lower pad in contact with the upper pad and the upper dielectric layer; and a lower dielectric layer that surrounds the lower pad and contacts the upper pad and the upper dielectric layer, the lower dielectric layer extends in the first direction and the second direction, wherein the upper pad, the upper dielectric layer, the lower pad, and the lower dielectric layer define an upper space that surrounds a lower portion of the upper pad and a lower space that surrounds an upper portion of the lower pad, wherein the upper space includes a first pad overlap section that overlaps the lower pad in a third direction that intersects the first direction and the second direction, and a first dielectric layer overlap section that overlaps the lower dielectric layer in the third direction, wherein the lower pad includes a first surface in contact with the upper dielectric layer and a second surface in contact with the upper pad, wherein the first pad overlap section is between the first surface and the second surface of the lower pad, wherein the first and second surfaces of the lower pad are flat, and wherein the lower pad further includes a protrusion part that protrudes between the first surface and the second surface of the lower pad.

12. The semiconductor device of claim 11, wherein the lower space includes a second pad overlap section that overlaps the upper pad in the third direction and a second dielectric layer overlap section that overlaps the upper dielectric layer in the third direction.

13. The semiconductor device of claim 12, wherein the upper pad includes a third surface in contact with the lower dielectric layer and a fourth surface in contact with the lower pad, and the second pad overlap section is between the third surface and the fourth surface of the upper pad.

14. The semiconductor device of claim 13, wherein the third and fourth surfaces of the upper pad are flat.

15. The semiconductor device of claim 12, wherein the first surface of the lower pad is between the first pad overlap section and the second dielectric layer overlap section.

16. The semiconductor device of claim 12, wherein a bottom surface of the upper dielectric layer includes a contact part in contact with the first surface of the lower pad, and wherein the contact part is between the first pad overlap section and the second dielectric layer overlap section.

17. The semiconductor device of claim 11, wherein the protrusion part includes an exposed surface that is revealed by the first pad overlap section, and wherein a level of an uppermost portion of the exposed surface is at a level higher than a level of the first surface and a level of the second surface in the third direction.

18. A semiconductor device, comprising:

a first substrate that extends in a first direction and a second direction that intersects the first direction;

a second substrate spaced apart from the first substrate and that extends in the first direction and the second direction;

a lower pad electrically connected to the first substrate;

a lower dielectric layer that surrounds the lower pad;

an upper pad electrically connected to the second substrate and in contact with the lower pad and the lower dielectric layer; and an upper dielectric layer that surrounds the upper pad and contacts the lower pad and the lower dielectric layer, wherein the upper pad, the upper dielectric layer, the lower pad, and the lower dielectric layer define an upper space that surrounds a lower portion of the upper pad and a lower space that surrounds an upper portion of the lower pad, wherein the upper space includes a first pad overlap section that overlaps the lower pad in a third direction that intersects the first direction and the second direction, and a first dielectric layer overlap section that overlaps the lower dielectric layer in the third direction, wherein the lower space includes a second pad overlap section that overlaps the upper pad in the third direction and a second dielectric layer overlap section that overlaps the upper dielectric layer in the third direction, wherein the lower pad includes a first protrusion part that protrudes toward the first pad overlap section, wherein the upper pad includes a second protrusion part that protrudes toward the second pad overlap section, wherein the first protrusion part is at a level higher than a level of a top surface of the lower dielectric layer in the third direction, wherein the second protrusion part is at a level lower than a level of a bottom surface of the upper dielectric layer in the third direction, wherein the upper pad includes a first surface in contact with the lower dielectric layer and a second surface in contact with the lower pad, and wherein the second protrusion part protrudes between the first surface and the second surface of the upper pad.

* * * * *